United States Patent [19]

Lee

[11] Patent Number: 4,839,301
[45] Date of Patent: Jun. 13, 1989

[54] BLANKET CMOS CHANNEL STOP IMPLANT EMPLOYING A COMBINATION OF N-CHANNEL AND P-CHANNEL PUNCH-THROUGH IMPLANTS

[75] Inventor: Ruojia R. Lee, Boise, Id.

[73] Assignee: Micron Technology, Inc., Boise, Id.

[21] Appl. No.: 286,361

[22] Filed: Dec. 19, 1988

[51] Int. Cl.$^4$ .................... H01L 21/265; H01L 27/08
[52] U.S. Cl. ........................ 437/29; 437/34; 437/70
[58] Field of Search .............. 437/28, 29, 34, 57, 437/70, 27, 30

[56] References Cited

U.S. PATENT DOCUMENTS

| | | |
|---|---|---|
| 4,554,726 | 11/1985 | Hillenius et al. ............... 437/29 |
| 4,743,563 | 5/1988 | Pfiester et al. ............... 437/24 |

FOREIGN PATENT DOCUMENTS 2118364  10/1983  United Kingdom .............. 437/57

Primary Examiner—Olik Chaudhuri
Attorney, Agent, or Firm—Stan Protigal; Angus Fox

[57] ABSTRACT

A CMOS transistor is fasbricated by forming the n-wells with both phosphorus and arsenic implants. The arsenic, with its lower diffusion coefficient, tends to concentrate near the top surface of the n-wells, with the phosphorus penetrating sufficiently to define the n-wells at the desired depth. A boron channel stop implant is later applied without masking over the n-wells. Since the arsenic implant is concentrated near the surface, the arsenic impurities overcome the effects of the boron impurities. Additional boron required for n-channel channel stop is provided by n-channel transistor punch-through implantation.

4 Claims, 5 Drawing Sheets

BLANKET CMOS CHANNEL STOP IMPLANT EMPLOYING A COMBINATION OF N-CHANNEL AND P-CHANNEL PUNCH-THROUGH IMPLANTS

FIELD OF THE INVENTION

This inveniton relates to VLSI semiconductor CMOS processes, and more specifically to blanket-channel stop implants of dopant into p-well and n-well regions. The invention is particularly applicable to dynamic random access memory devices (DRAMS).

BACKGROUND OF THE INVENTION

The invention uses various materials which are electrically either conductive, insulating or semiconducting, although the completed semiconductor circuit device itself is usually referred to as a "semiconductor". One of the materials used is silicon, which is used as either single crystal silicon or as polycrystalline silicon material, referred to as polysilicon or "poly" in this disclosure.

In many transistor circuits, it is necessary to form both n-channel transistors and p-channel transistors, in a complimentary metal oxide semiconductor (CMOS) circuit.

In the fabrication of a CMOS circuit, an n-well is first formed by masking a semiconductor wafer and implanting an impurity. The impurity is intended to infiltrate to a sufficient depth to define the n-well, as an n- material of sufficient depth to permit the functioning of the p-channel transistor circuit.

A typical dopant used is phosphorus, which has a characteristic of being fairly easy to control in depth and distribution.

After forming the n-wells, a thin layer of oxide, in the range of 250 Å, is grown on the wafer to form an initial oxide layer. The nitride is deposited and the wafer is then masked again for the purpose of defining active areas (AA). The mask is stripped and a photomask is then applied over n-wells. A boron implant is applied to the p-type area, with the boron functioning as a channel stop implant. The boron does not penetrate the nitride and, therefore, the nitrided areas do not receive the channel stop implant. The photoresist is then stripped and fieldox (field oxide) is grown in areas which are not layered with nitride. The wafer is then masked again in order to shield the n-well and a punch-through implant is applied to the n-type transistors, using boron dopant.

As shown in FIG. 1, the relationship of the length of a transistor and threshold voltage is not significant until the transistor becomes fairly short. At that point, the threshold voltage rapidly decreases along with the rapid decrease in length. This can be seen by reading the graph from right to left, where one is observing the effects of the reduction in length. FIG. 2 shows the subthreshold characteristics of normal-channel and short-channel transistors. A normal channel tends to present a step in conductivity, as is the expected characteristic of the transistor. Short-channel transistors, on the other hand, behave more as a resistor than a transistor when compared to the behavior of a normal-channel transistor.

In sub-micron transistors, the punch-through implant is necessary in order to avoid short-channel effects in the n-channel transistors. In the short-channel effect, the space between transistor source and drain is short enough that the potential between source and drain may be sufficient to cause the transistor to conduct, due to so-called drain induced barrier lowering. Short-channel effects include threshold voltage roll-off and drain-source punch through at high drain voltage.

In order to increase the n-channel field threshold voltage, one would increase field oxide thickness and/or implant impurities below the field oxide. Boron is used as an impurity in a punch-through implant process, wherein sufficient energy is applied during implant to cause the boron to penetrate the field oxide. Therefore, the high energy boron punch-through implant can both reduce n-channel short-channel effects and at the same time, improve n-channel field transistor threshold voltage.

It is therefore an object of the present invention to reduce the short-channel effects of submicron transistors. It is also desirable that the process of manufacturing the transistors uses a minimum of mask steps; therefore, any modification of the process should ideally not increase mask steps.

Blanket implant some boron through the field area prior to growth of field oxide, in order to raise n-channel field transistor threshold voltage $V_T$. P-channel field transistor $V_T$ may be degraded by this blanket boron implant, but will be improved by the use of arsenic in n-wells. N-channel field transistor $V_T$ is further increased by the use of boron high energy punch-through implant.

The choice of dopants is made in accordance with the electrical effects of the dopant and the ease at which the dopant is implanted. Since the ease of implant affects the distribution of the dopant, this, of course, also affects the electrical characteristics of the device. As mentioned, phosphorus is a fairly easy material to implant with in that it requires a relatively low energy to penetrate the silicon wafer to a desired depth. Other dopants, such as arsenic, require more energy and tend to concentrate at a certain level; this level is determined by the amount of energy used in implanting the dopant.

Since phosphorus is said to have a high diffusion coefficient, meaning that phosphorus is relatively easy to be diffused by implanting into the wafer. Arsenic, on the other hand, has a lower diffusion coefficient. Applying more energy to diffuse arsenic results in the arsenic concentrating at a different level, a phenomenon which is referred to (at least here in Idaho) as the snowplow effect.

In the prior art, n-channel transistors are provided with a channel stop implant by first photomasking over the p-channel areas, and then applying the implant. The implant is a boron implant which creates a p+ material under areas which will eventually be defined as field by growing fieldox. The mask is used to prevent the boron from penetrating the transistor areas and thereby shorting the p-channel transistors.

From economical points of view, it is desirable to omit the number of mask steps used for fabricating integrated circuits. Therefore, any solution to the short-channel effect should not result in substantially increasing masking; ideally it should result in a decrease in mask steps.

SUMMARY OF THE INVENTION

According to the present invention, a CMOS transistor is fabricated by forming the n-wells with both phosphorus and arsenic implants. The arsenic, with its lower diffusion coefficient, tends to concentrate near the top surface of the n-wells, with the phosphorus penetrating sufficiently to define the n-wells at the desired depth. The use of arsenic will (1) improve p-channel short-channel effects, and (2) compensate low-dose boron from blanket boron field implant and hence save one mask.

A boron channel stop implant is later applied without masking over the n-wells. Therefore, the boron implant for the n- and p-channels causes the boron to also be diffused into the n-wells. Since the arsenic implant is concentrated near the surface, the arsenic impurities overcome the effects of the boron impurities, thereby causing the top surface of the n-wells to remain as n-material.

It is therefore necessary to adjust and to optimize the concentration of arsenic dopant to that which would allow the n-well to remain as n-material and avoid the short-channel effect. It is also necessary to optimize the blanket boron field implant so that the degradation of p-channel field transistor $V_T$ will not be greater than the improvement made by the arsenic dopant punch-through. The high energy boron implant, on the other hand, will be determined by the n-channel device requirements and by the additional n-channel field transistor $V_T$ improvement requirements.

Prior art techniques use blanket channel stop implant by only introducing arsenic in the n-well. This invention, however, uses blanket channel stop implant by both introducing slight amount of arsenic in n-well and at the same time, the n-channel punch-through implant to improve the n-channel field transistor characteristics. Without the n-channel punch-through implant, the n-channel field transistor characteristics may be degraded. Also, without the n-channel punch-through implant to improve the n-channel field transistor $V_T$, more blanket boron field implant dose will be required. This, in turn, will require more arsenic in the n-well to compensate for the boron. Too high arsenic will inevitably degrade p-channel transistor and speed.

DETAILED DESCRIPTION OF THE PREFERRED EMBODIMENT

Figure 1:
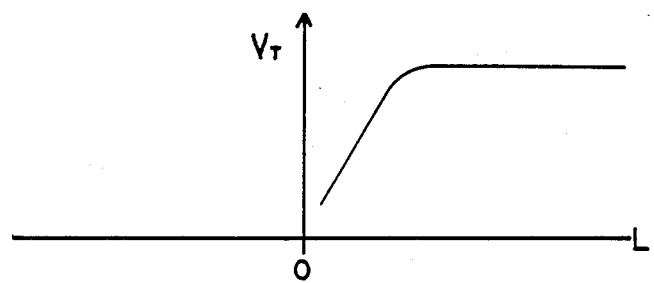
FIG. 1 is a graph of $V_T$ versus transistor length, showing the short-channel effect on $V_T$ of a transistor.
Figure 2:
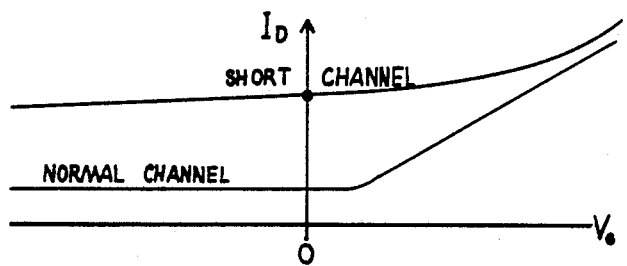
FIG. 2 is a graph of current versus voltage for a short-channel and normal-channel transistors.
Figure 3:
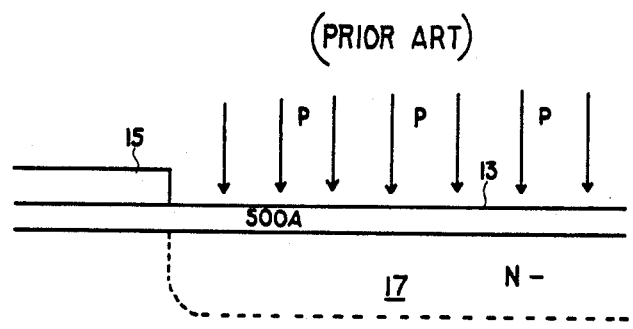
FIG. 3 (prior art) shows a cross-section of a wafer during the fabrication of a semiconductor circuit device, in which dopants are applied to form n-wells.

In order to fabricate the CMOS transistor, a wafer 11 has an initial oxide layer 13 grown on a top surface. Wafer 11 is masked (not shown) and nitride 15 is deposited over unmasked areas which will define p-type areas. Wafer 11 is then subjected to an n-well implant in order to define n-wells 17. The n-well implant is with a dopant which is selected to diffuse to a depth which defines the n-well 17. In the prior art, phosphorus has been chosen as an implant material because of its favorable diffusion coefficient.

After the diffusion, the nitride 15 is removed from the p-type areas and nitride is applied to define field areas, as shown at 21.

In the prior art, the n-wells were masked by a mask 25 and a boron implant was applied to the p-type material in order to form a channel stop implant in the unnitrided areas, with the nitride 21 blocking with the boron from active areas. The mask 25 prevents the boron from being implanted into the n-wells. After the implant, the mask 25 is stripped and oxide is grown on the field areas defined by the absence of nitride 21, forming fieldox (field oxide) 27. As a result of prior implant of boron, p+ areas include two phases of p-type material remaining under the fieldox 27. This increases parasitic field transistor threshold voltage $V_{TF}$.

Subsequent to growth of fieldox 27, the n-wells are masked off (at 31) a high energy implant of boron is applied to the n-channel areas. This implant causes the boron to penetrate to a depth below the surface of the active area, where the boron concentrates. The high energy implant also permits the boron to penetrate the fieldox 27, but because of the assistance of the fieldox 27, the boron has less penetration of the field silicon.

The mask 31 is stripped and polysilicon (poly) 35 is deposited, and the wafer is further processed in order to establish a desired circuit.

Figure 8:
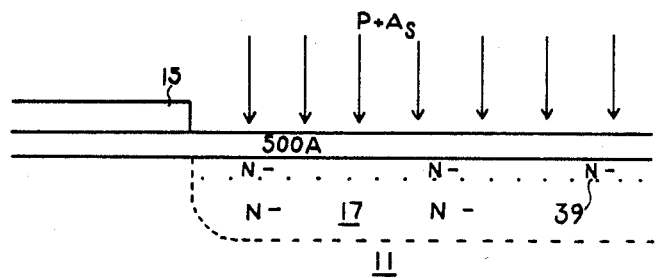
FIG. 8 shows the configuration of FIG. 3, in which multiple dopants are used to absorb the effects of the n-wells being exposed to p-channel dopants.

Referring to FIG. 8, it is possible to augment the initial n-well implant by using a dopant with a lower diffusion coefficient. This results in a top layer of the n-wells having a higher concentration of impurity forming n- material. This is indicated by dotted line 39. In the preferred embodiment, arsenic is used as the additional impurity, because it cooperates well with the phosphorus implant. This supplemental implant of arsenic further reduces any short-channel effect of p-channel transistors.

Figure 4:
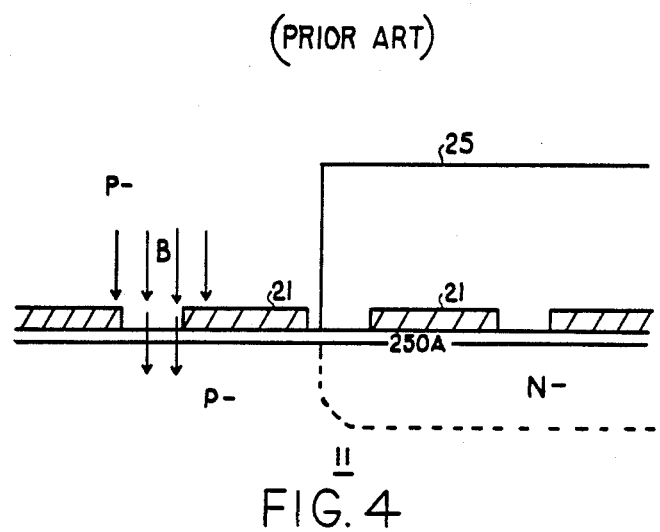
FIG. 4 (prior art) shows the masking and implantation of dopants into the p-type areas.
Figure 5:
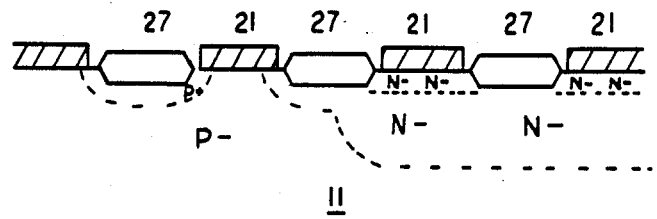
FIG. 5 shows the growth of fieldox after formation of the p-channel and n-channel areas.
Figure 9:
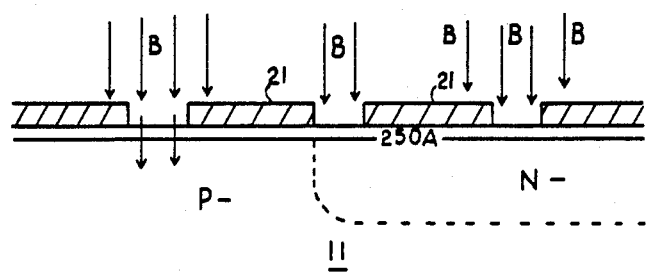
FIG. 9 shows the implementation of dopants for p-type areas in accordance with the present invention.

In addition, the supplemental implant permits the boron implant to be performed without masking the n-wells (mask 25 in FIG. 4). Therefore, as shown in FIG. 9, the boron impurities are permitted to penetrate the n-wells. Since the diffusion of arsenic has a shallow profile (dotted line 39), the boron implanted into the n-wells is counteracted by the arsenic and, therefore, has not damaged the n-well cirucits.

In order to limit the effect of the boron, it is necessary to place limitations on the amount of boron which may be applied in this step. In this manner, the ability of the supplemental implant (the arsenic) to negate the effects of the boron in the n-wells is assured. By limiting the amount of boron and applying the arsenic as a supplemental n-well implant, it is possible to eliminate the initial boron implant mask step.

Figure 6:
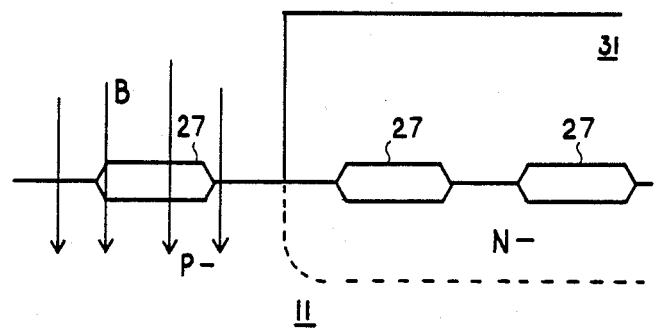
FIG. 6 shows masking subsequent to growth of fieldox and punch-through high energy implant step applied to the p areas.
Figure 7:
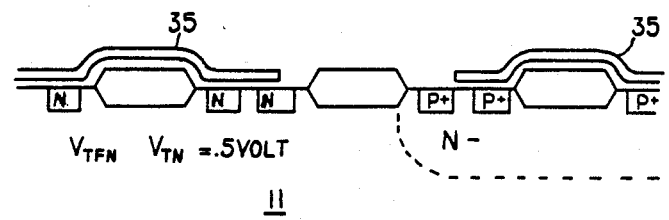
FIG. 7 shows a configuration of the transistor after deposition of polysilicon for transistor gate formation and some interconnects.

In order to make up for the reduced amount of boron applied, it is then necessary to mask the n-wells after the formation of field oxide, as shown in FIG. 6. A high energy implant is applied to the p areas in order to provide a channel stop characteristic in the p areas. This implant is applied with sufficient energy to penetrate the fieldox 27 in the (unmasked) p areas. The high energy boron implant is used to isolate devices in the p areas. Since this "punch-through" implant had been required, for another purpose, which is to increase n-channel transistor punch-through voltage and to reduce n-channel transistor short-channel effects, this masking does not present a further mask step. The shortfall of boron under the fieldox 27 is made up by controlling the amount of punch-through implant applied at this step.

For this reason, it is possible to reduce the short-channel effect of the n-type transistors while at the same time maintaining the integrity of the n-channel field transistors against the potential turn-on.

The high energy boron punch-through implant into the n-channel transistor will reduce so-called transistor short-channel effects by reducing the drain electric field penetration, a phenomenon called drain-induced barrier lowering (DIBL). This is crucial for sub-micron channel length n-channel transistors.

What has been described is a very specific process in which transistors are formed from a single layer of polysilicon 35. It is, of course, possible to use the inventive techniques forming transistors with multiple layers of polysilicon, as is anticipated in the design of devices using the inventive technique. It is also possible to use the inventive techniques in a variety of circuit devices which utilize n-wells and substrate junctions. Accordingly, the invention should be read as limited only by the claims.

I claim:

1. Method of fabricating transistor circuits having complimentary p-channel and n-channel transistors, in which n-wells are formed in a semiconductor wafer in areas at which p-type transistors are formed, the n-wells being defined by implanting the wafer with impurities sufficiently to define the n-wells, and areas of the wafer outside of the n-wells being p areas, the method characterized by:

(a) applying a supplemental implant material to the areas at which p type transistors are formed, the supplemental implant material being an n type dopant and having a diffusion coefficient which is less than that of the implant material used to define the n-wells;

(b) applying an impurity to the wafer which is sufficient to result in p areas being formed outside of the n-wells, but insufficient to overcome the definition of the n-wells where the supplemental implant is applied, said insufficiency resulting in p areas not being formed in the n-wells because said impurity is counteracted by the supplemental implant;

(c) growing field oxide areas on the p areas;

(d) masking the n-wells;

(e) applying a high energy implant of dopant to the p areas subsequent to said growth of field oxide areas and said masking; and (f) said high energy implant being sufficient to pass through the field oxide areas on the p areas.

2. Method of fabricating transistor circuits as described in claim 1, further characterized by:

the material used to define the n-wells having a high diffusion coefficient, as compared to the supplemental implant material, to the extent that the supplemental implant exhibits a substantial snowplow effect within the n-wells.

3. Method of fabricating transistor circuits as described in claim 1, further characterized by:

the implant material used to define the n-wells being phosphorus and the supplemental implant material being arsenic.

4. Method of fabricating transistor circuits as described in claim 1, further characterized by:

the choice of implant materials being made in accordance with the ease at which the dopant is implanted, so that the distribution of the dopant results in a high concentration of minority carriers closer to a top surface and a lesser concentration of minority carriers to a desired depth further from the top surface, the desired depth defining the n-wells.

* * * * *